US008065623B2

(12) United States Patent
Bohlman

(10) Patent No.: US 8,065,623 B2
(45) Date of Patent: Nov. 22, 2011

(54) METHOD FOR DESIGNING A CUSTOMIZED WORK AREA

(75) Inventor: Jeffrey G. Bohlman, Green Bay, WI (US)

(73) Assignee: Krueger International, Inc., Green Bay, WI (US)

( * ) Notice: Subject to any disclaimer, the term of this patent is extended or adjusted under 35 U.S.C. 154(b) by 1130 days.

(21) Appl. No.: 11/751,442

(22) Filed: May 21, 2007

(65) Prior Publication Data

US 2007/0276635 A1   Nov. 29, 2007

Related U.S. Application Data

(60) Provisional application No. 60/802,748, filed on May 23, 2006.

(51) Int. Cl.
*G06F 3/048* (2006.01)
*G06F 3/01* (2006.01)

(52) U.S. Cl. ........ 715/768; 715/763; 715/767; 715/961; 715/964

(58) Field of Classification Search ................... 715/716, 715/719–726, 730, 757, 764, 767, 744, 745, 715/762, 763, 768, 781, 788, 848, 849, 961, 715/964; 348/14.05, 159, 211.12
See application file for complete search history.

(56) References Cited

U.S. PATENT DOCUMENTS

| | | | |
|---|---|---|---|
| 5,111,392 A | 5/1992 | Malin | |
| 5,255,207 A | 10/1993 | Cornwell | |
| 5,293,479 A | 3/1994 | Quintero et al. | |
| 5,737,554 A * | 4/1998 | Epelman-Wang et al. | ... 715/862 |
| 5,748,943 A | 5/1998 | Kaepp et al. | |
| 5,767,897 A * | 6/1998 | Howell | ........................ 348/14.07 |
| 5,796,401 A * | 8/1998 | Winer | ............................ 345/619 |
| 5,929,856 A * | 7/1999 | LoNegro et al. | .............. 715/839 |
| 6,014,503 A * | 1/2000 | Nagata et al. | ..................... 703/1 |
| 6,016,147 A * | 1/2000 | Gantt | ............................ 345/420 |
| 6,040,841 A * | 3/2000 | Cohen et al. | .................. 345/473 |
| 6,052,669 A | 4/2000 | Smith et al. | |
| 6,386,985 B1 * | 5/2002 | Rackham | ........................ 472/75 |
| 6,414,679 B1 * | 7/2002 | Miodonski et al. | ........... 345/420 |
| 6,446,994 B1 | 9/2002 | Smerdon, Jr. | |
| 6,573,903 B2 * | 6/2003 | Gantt | ............................ 345/619 |
| 6,727,925 B1 * | 4/2004 | Bourdelais | ..................... 715/852 |
| 6,754,904 B1 * | 6/2004 | Cooper et al. | .................. 725/32 |
| 6,778,870 B1 | 8/2004 | Li et al. | |
| 6,847,853 B1 | 1/2005 | Vinciarelli et al. | |
| 6,912,429 B1 * | 6/2005 | Bilger | ............................ 700/19 |
| 7,062,722 B1 * | 6/2006 | Carlin et al. | .................. 715/850 |
| 7,277,572 B2 * | 10/2007 | MacInnes et al. | ............ 382/154 |

(Continued)

*Primary Examiner* — Nicholas Augustine
(74) *Attorney, Agent, or Firm* — Andrus, Sceales, Starke & Sawall, LLP

(57) ABSTRACT

A system for designing a work area enables a user to initially specify a particular item to be designed into the work area from a number of different items contained in the system. The system utilizes stored information concerning the item to graphically display the selected item to the individual. Once the item has been selected, the system enables the individual to incorporate the item into the work area, along with other items. The system indicates the item on a display using a "ghost image". The dimensions of the item can be varied from preselected dimensions and other components can be interconnected or positioned in the work area. The system can provide feedback to the user regarding what components can be added at any particular location. The system determines the proper style, width, height, options, position, and rotation for the item and any interconnected components to create a valid design.

9 Claims, 10 Drawing Sheets

U.S. PATENT DOCUMENTS

| | | | |
|---|---|---|---|
| 7,298,930 B1* | 11/2007 | Erol et al. | 382/305 |
| 7,493,387 B2* | 2/2009 | Creamer et al. | 709/224 |
| 7,523,411 B2* | 4/2009 | Carlin | 715/782 |
| 2002/0032546 A1* | 3/2002 | Imamura et al. | 703/1 |
| 2004/0113945 A1 | 6/2004 | Park et al. | |
| 2005/0066309 A1* | 3/2005 | Creamer et al. | 717/127 |
| 2005/0151743 A1* | 7/2005 | Sitrick | 345/473 |
| 2005/0267900 A1* | 12/2005 | Ahmed et al. | 707/100 |
| 2006/0044307 A1* | 3/2006 | Song | 345/419 |

* cited by examiner

| OHEAD | OPUS | ELEC | ACC | MACRO | WINDOW | EXP |

| | |
|---|---|
| UNIVERSAL OVERHEAD | <UO> |
| VENUS OVERHEAD | <VO> |
| STD OVERHEAD | <OH> |
| OFF MODULE OVERHEAD TASKBOARD | ▷ |
| DESIGNER LIGHTING | ▷ |
| AUTO STD TASK LIGHT | <LT> |
| OVERHEAD CHANGE | |

FIG. 2

| | |
|---|---|
| TYPICAL | <TYPICAL> |
| UNIVERSAL OVERHEAD | <UO> |
| VENUS OVERHEAD | <VO> |
| SCREEN | <VSCR> |
| TASK LIGHT | <LT> |
| WORKSURFACE ACC. | <WA> |
| RIGID WIREWAY | <PR> |
| DUPLEX OUTLET | <CL> |
| PABER MGTI | <PMGT> |
| PEDESTAL | <PED> |
| TRANSITION | <TRANS> |
| MODESTY | <MODESTY> |
| BACKPACK | <VEP> |

FIG. 3

| OHEAD | STORAGE TABLES ELEC ACC MAC |
|---|---|
| UNIVERSAL OVERHEAD | <UO> |
| RADIUS FRONT OVERHEAD | <RF> |
| BALANCE / VENUS OVERHEAD | <VO> |
| STD. OVERHEAD | <OH> |
| STD. FLIPPER BACK PLATE | <FDB> |
| DESIGNER LIGHTING | ▶ |
| AUTO STD. TASK LIGHTS | <LT> |
| OVERHEAD CHANGE | <OHCHG> |
FIG. 12
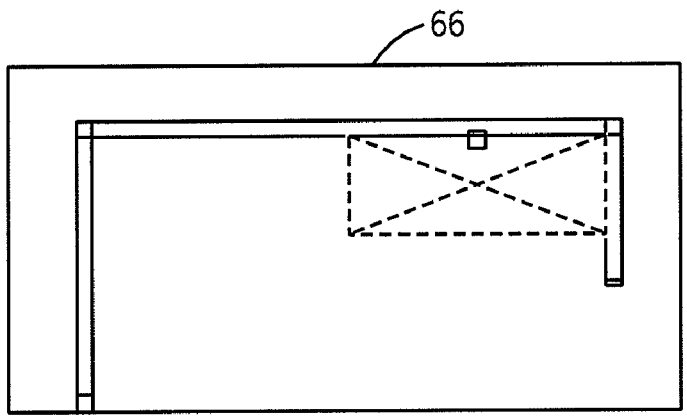
FIG. 13
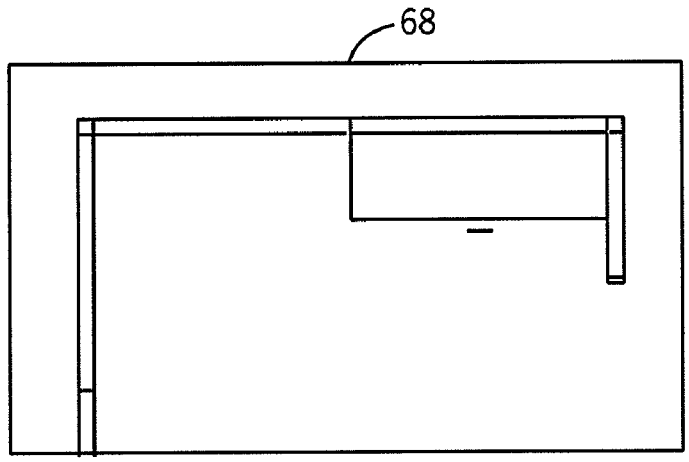
FIG. 14

METHOD FOR DESIGNING A CUSTOMIZED WORK AREA

CROSS-REFERENCE TO RELATED APPLICATION

This application claims the benefit of U.S. Ser. No. 60/802,748, filed May 23, 2006, assigned to the Assignee of this application, and the disclosure of which is incorporated herein by reference.

FIELD OF THE INVENTION

This invention relates generally to the design of work areas, and in particular, to a process of designing a customized work area that utilizes predetermined stored information.

BACKGROUND OF THE INVENTION

Professionals in the office furniture industry customarily utilize various types of computer-based, graphics software to facilitate the design and layout of office space. The graphics software automates the design and specification process, thereby allowing a user to create large scale drawings on a computer screen that, in addition to assisting with layout, may also be used in the pricing of the project. Typically, the graphics software incorporates a computer-aided design (hereinafter "CAD") program that enables users to design the office space on the computer screen. In order to enhance the functionality of the CAD program, various add-on modules have been developed. For example, these add-on modules allow the user to view a design from any angle and to zoom in or pan out for close-ups and long-distance views of the design. In addition, these add-on modules may keep track of various design dependencies so that when the user changes the value of one or more design criteria, the values of all the other design criteria that depend upon the changed criteria are automatically changed.

While functional for their intended purpose, these prior graphics software packages have significant drawbacks that limit their usefulness to the office furniture professional. For example, in the furniture industry, the add-on modules are menu driven. As such, in operation, the designer must input the dimensions of the office space being designed. Thereafter, the designer is lead through a series of menus similar to paging through a catalog until the designer arrives at a desired product. Once the desired product is located, the designer selects the desired product and the product is displayed on the computer screen. The designer must then manually position the selected product at a desired location in the office space displayed on the computer screen. The process is repeated until the design of the office space is completed. It can be appreciated that the process is not only time consuming, but requires the designer to have extensive knowledge of the product line of an office furniture supplier in order to complete a valid design.

BRIEF SUMMARY OF THE INVENTION

This application relates to a system for designing a work area, which enables a user to initially specify a particular item to be designed into the work area, from a number of different items contained in the system (e.g. overhead cabinets, worksurfaces, tackboards, markerboards, load bars, tool rails, pedestals, task lights, support panels, support brackets, worksurface accessories, and electrical components). The system then utilizes stored information concerning the item selected to graphically display the selected item to the individual. Once the item has been selected, the system enables the individual to incorporate the item into the work area, along with other items. The system, again utilizing the stored information about the items, and each of the available components for use with the items, indicates the item on a display using a "ghost image" of the item. The dimensions of the item can be varied from preselected dimensions and other components can be interconnected with the item or positioned in the work area using the same procedure. By displaying a "ghost image", the system provides feedback to the user regarding what components can be added at any particular location. After the item is selected, the system calculates the proper style, width, height, options, position, and rotation for the item and any interconnected components to create a valid design. The same analysis is performed by the system for each component, option, or dimension change, such be made by the user by selecting a particular "ghost image" on the display.

Therefore, in accordance with one aspect of the present invention, a method of designing a workspace on a computer screen is disclosed. The method includes the steps of depicting a predetermined area on the computer screen representative of the workspace and selecting one of a plurality of objects for positioning in the predetermined area and providing the same as a selected object. The method further includes the step of generating a ghost image of the selected object on the computer screen, as well as the step of positioning the ghost image at a user desired location in the predetermined area. The method further includes the step of placing the selected object in a predetermined area on the computer screen.

In accordance with another aspect, the present invention is directed to a workspace design module operative with a computer-aided design program. The design module has a stored program representative of instructions to be executed by a computer that cause the computer to graphically depict a workspace on a computer screen and display a list of workspace furniture components available for the workspace. The instructions further cause the computer to generate a ghost image for a selected component and display the ghost image on a computer screen. The computer is further caused to place the selected component at a user defined location in the workspace based on the position of the ghost image on the computer screen.

Various other features, objects, and advantages of the present invention will be made apparent from the following detailed description and the drawings.

BRIEF DESCRIPTION OF THE DRAWINGS

The drawings furnished herewith illustrate a preferred embodiment of the present invention in which the above advantages and features are clearly disclosed as well as others which will be readily understood from the following description of the illustrated embodiment.

In the drawings:

FIG. 2 is a schematic view of a pull down menu for ghost image commands for a product sub-group for a product line;

FIG. 3 is a schematic view of an auxiliary menu for various ghost image commands for a product sub-group for a product line;

FIG. 12 is a schematic view of a pull down menu for an overhead placement command;

FIG. 13 is a sample screen shot depicting a ghost image of an overhead;

FIG. 14 is a sample screen shot depicting an overhead;

DETAILED DESCRIPTION OF THE DRAWINGS

Figure 1:
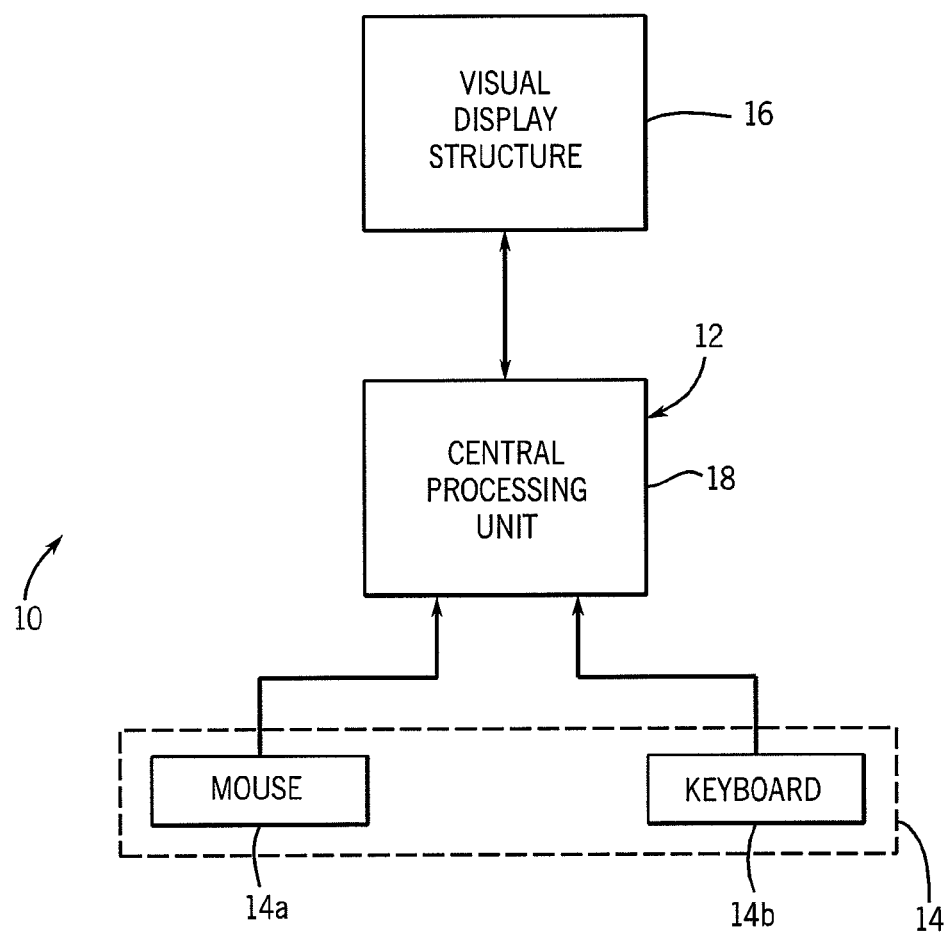
FIG. 1 is a schematic view of an apparatus for executing the methodology for designing a customized work area in accordance with the present invention.

Referring to FIG. 1, an apparatus for executing the methodology of the present invention is generally designated by the reference numeral 10. Apparatus 10 includes a computer 12 defined by input device 14 such as a mouse 14a and/or keyboard 14b, visual display structure 16 such as a monitor and central processing unit 18 (hereinafter referred to as "CPU"). It is contemplated for CPU 18 to execute a computer software program that effectuates the methodology of the present invention. It is intended for the computer software program to incorporate a standard CAD program that allows a user to view a design on visual display structure 16 from any angle, to zoom in or pan out for close-ups and long-distance views of the design, and to keep track of various design dependencies so that when the user changes the value of one or more design criteria, the values of all the other design criteria that depend upon the changed criteria are automatically changed accordingly.

The present invention contemplates a ghost image-based command system wherein a user utilizes input device 14 to select a predetermined product sub-group. More specifically, it is contemplated for various ghost image commands for a product sub-group for a product line to be displayed on visual display structure 16 in the form of a pull-down menu, FIG. 2, or an auxiliary menu, FIG. 3, activated by a predetermined input entry, e.g., Ctrl-Right click of mouse 14a. As hereinafter described, in response to the user's selection, an analysis portion of the software program determines the appropriate style, width, height, position, rotation and various other options for the selected sub-group that are required for accurate design validation. A continuous graphical feedback is provided to the user at the point of design.

Figure 4:
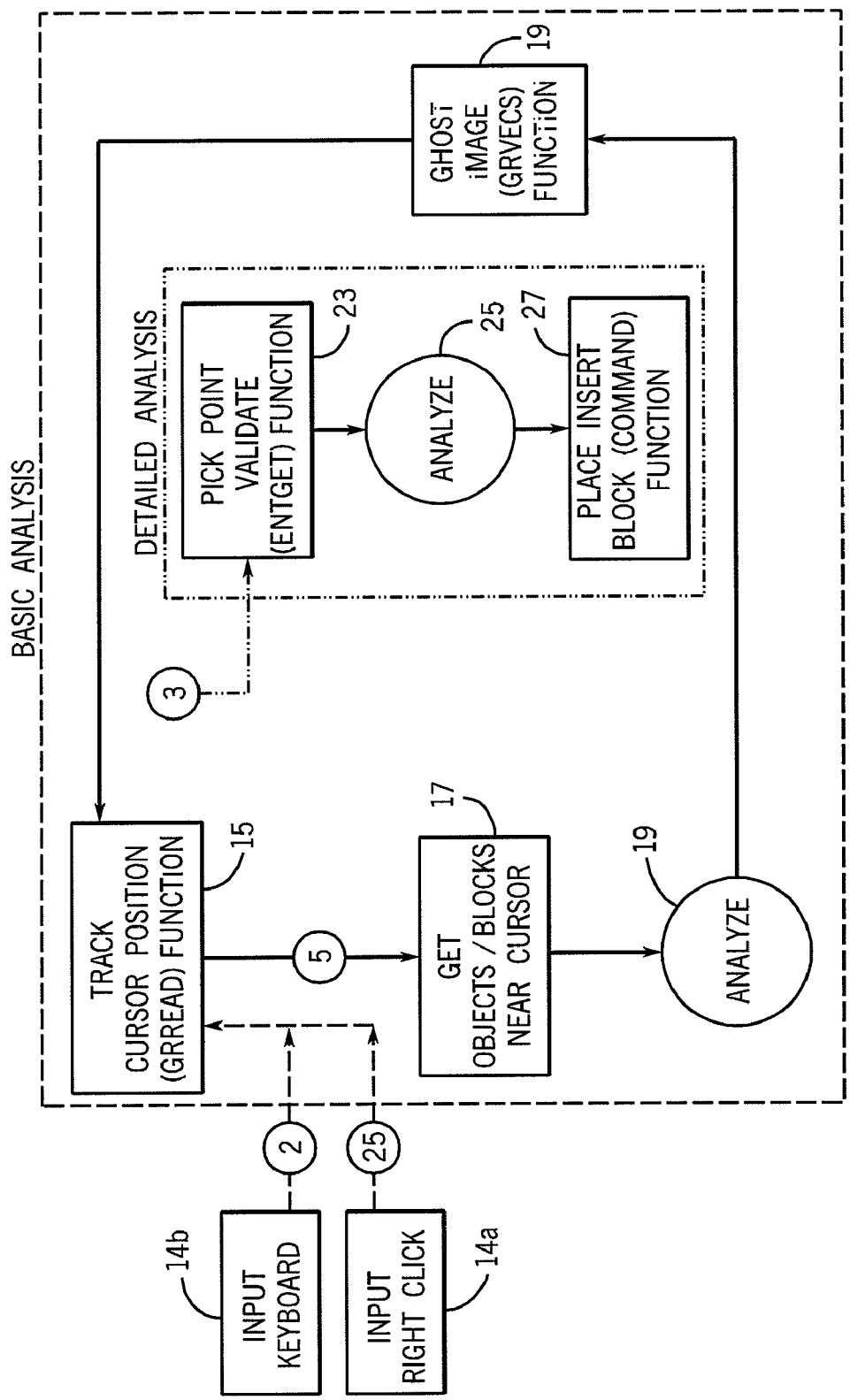
FIG. 4 is a schematic view of the methodology for designing a customized work area in accordance with the present invention.

Referring to FIG. 4, the core functionality of the method of the present invention lies in the recursive use of the "GRREAD" function, block 15, wherein the input devices, namely, mouse 14a and keyboard 14b, allow the user/designer to place an object in a design by providing input points, selection sets, numbers and other data to the software program as the user interacts with the objects in the drawing. The values entered by the user using mouse 14a and keyboard 14b tells the program what type of user input is being used. This continuous feedback is fed back to the program, block 17, where the first stage of detailed analysis takes place, block 19. As the first detailed analysis is performed and the design criteria is validated, the "GRVECS" function displays a ghost image in real time near the cursor, block 21, indicating to the user that a valid design criteria has been met. This ability to display feedback at the cursor position keeps the user focused on design tasks and objects instead of a display located on another part of visual display structure 16. The user then selects a point, block 23, and a second, more detailed analysis takes place, block 25. Information on all design objects near the selected point is gathered and reviewed. This second stage of analysis searches for design components that may interfere with the object being placed (e.g., a pedestal too deep for a worksurface) or if existing product may require a change in the 3D elevation of the product being placed (e.g., stacking overheads on top of one another). If the second stage of analysis meets design parameters, the object is placed in the design, block 27, and displayed by visual display structure 16.

In operation, it is contemplated for a user to enter the dimensions and floor plan of workspace utilizing mouse 14a and/or keyboard 14b such that the computer software program generates a drawing of the floor plan on visual display structure 16. Using the ghost-image commands, the major design components to be provided in the office space are placed in the floor plan throughout the drawing, as hereinafter described. For example, ghost-image commands may be used to position components such as the following:

1) Tackboards and Markerboards;
2) Load Bars and Tool Rails;
3) Pedestals;
4) Task Lights;
5) Worksurfaces, Countertops, Support Panels, Support Brackets;
6) Worksurface Accessories (center drawers, keyboards); and
7) Electrical Components (outlets, jumpers/connectors, feeds).

It is noted that the steps taken to position each component in the drawing are identical, but for the process used to verify product design parameters. As such, the following examples describing the placement of certain components in the drawing are understood to describe the steps necessary to effectuate the placement of each of the above identified components as if fully described herein.

Figure 5:
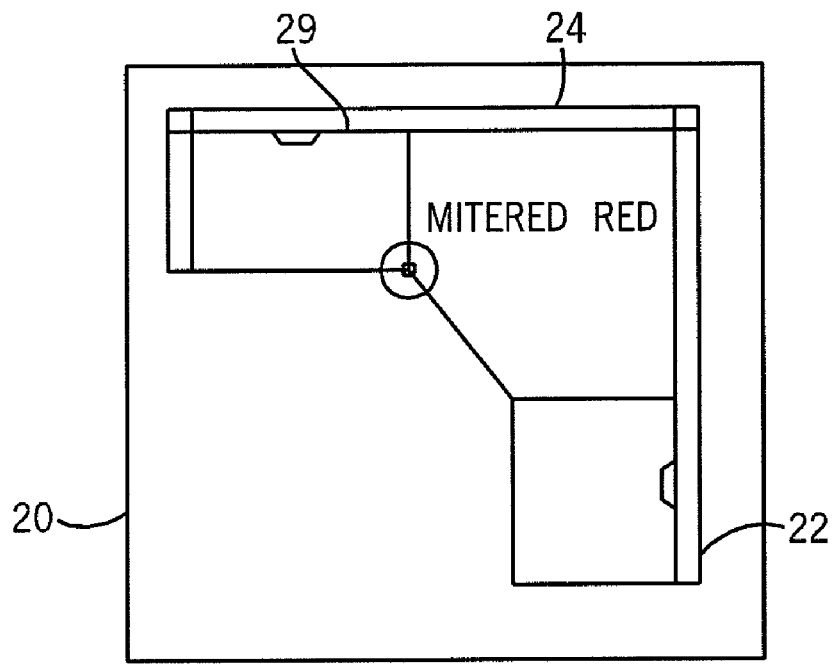
FIG. 5 is a sample screen shot depicting a mitered corner reduction worksurface.
Figure 6:
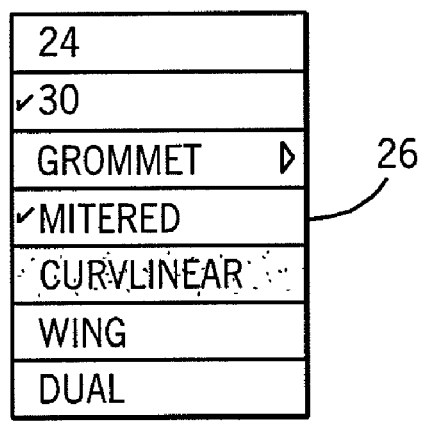
FIG. 6 is a schematic view of a pull down menu for use in varying the style of the mitered corner reduction worksurface of FIG. 5.
Figure 7:
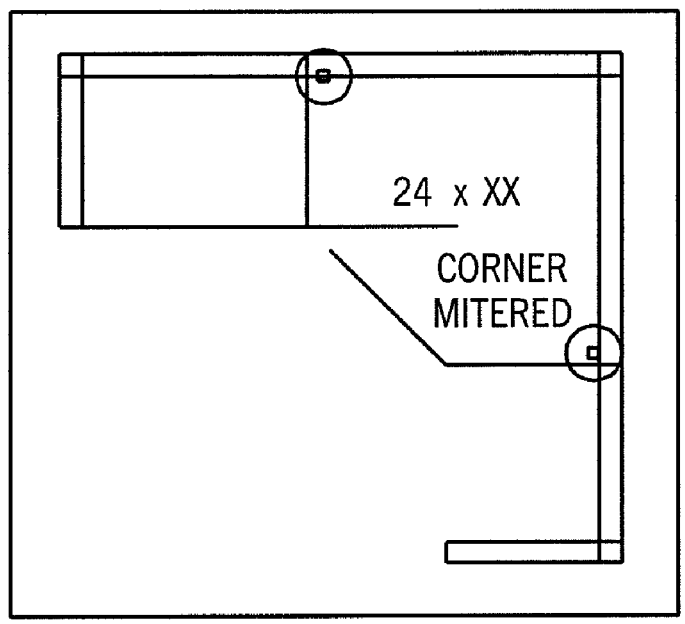
FIG. 7 is a sample screen shot depicting a standard corner worksurface.

In order to position a worksurface in the drawing, the worksurface command is utilized. Referring to FIG. 5, in order to position a mitered corner reduction worksurface in the drawing, first and second rectangular worksurfaces 20 and 22, respectively, are specified prior to specifying corner worksurface 24. Using mouse 14a, the cursor is hovered over the right leading edge 29 of worksurface 20 on the left hand side of corner worksurface 24 and a ghost image is generated as heretofore described. To switch the style of corner worksurface 24, a user right clicks mouse 14a while the ghost image is displayed to generate drop down menu 26, FIG. 6. Thereafter, using drop down menu 26, the user specifies the length and the style (e.g., mitered, curvilinear, dual, and wing) for worksurface 24. Referring to FIG. 7, standard corner worksurfaces, such as mitered, curvilinear, wing, and dual corner worksurfaces, can be specified by stretching the leading edge of the workspace between the corners of adjacent worksurfaces. It is contemplated for the software program to allow a user to specify worksurface when the panels defining the work area oriented at angles other than 0 degrees.

Figure 8:
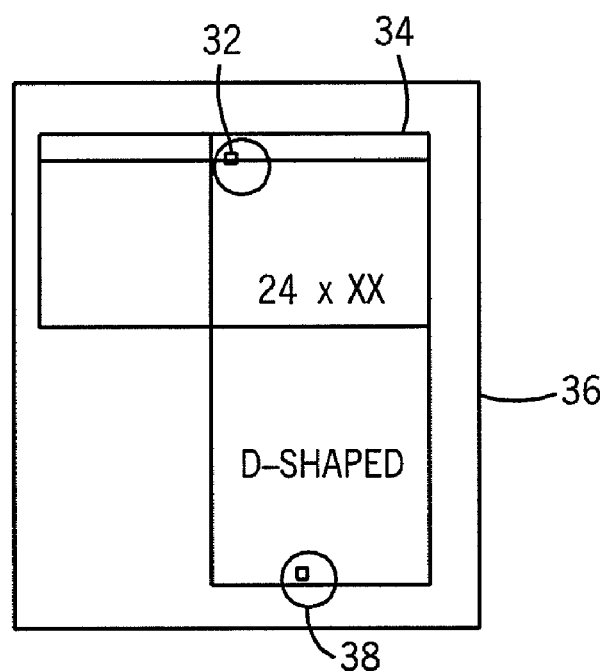
FIG. 8 is a sample screen shot depicting a D-shaped worksurface.

Referring to FIG. 8, in order to position a D-shaped worksurface in the drawing, the cursor is moved with mouse 14a to first point 32 near the left side of panel 34. After the ghost image turns white and the user selects the first point, the width of worksurface 36 is locked. To specify the depth of panel-mounted, D-shaped worksurface 36, the cursor is moved away from panel 34 until the desired depth is reached. Thereafter, the user selects second point 38 to place D-shaped worksurface 36 in the design.

Figure 9:
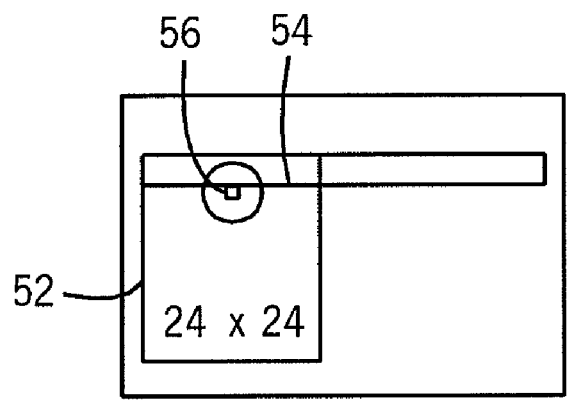
FIG. 9 is a sample screen shot depicting a rectangular worksurface having a width corresponding to multiple panels.
Figure 10:
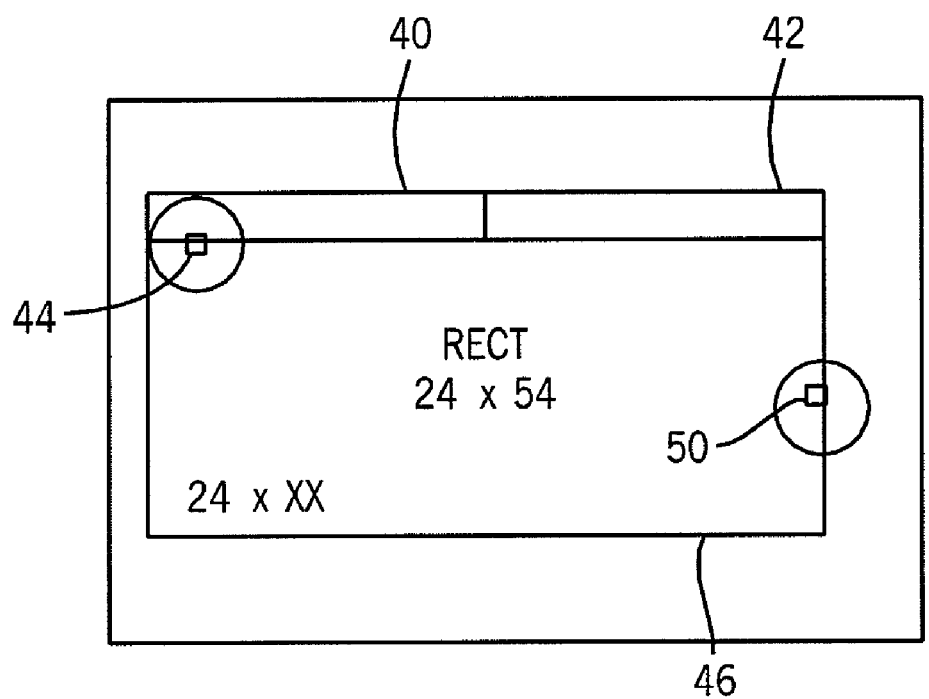
FIG. 10 is a sample screen shot depicting a rectangular worksurface for use with a single panel.

Referring to FIG. 9, in order to position rectangular worksurface 52 having a width equal to the width of panel 54, a user selects point 56 when the ghost image is a predetermined color, e.g., green. Alternatively, referring to FIG. 10, in order to position a rectangular worksurface having a width corresponding to multiple panels 40 and 42, the user moves the cursor with mouse 14a to first point 44 near the left side of panel 40. After the ghost image turns white, the user selects first point 44. The user then moves the cursor with mouse 14a to adjust the width of worksurface 46. It is contemplated for the width to change in predetermined increments as the user moves the cursor away from the first point selected. The depth of worksurface 46 can also be toggled with the right-click feature described above or the D key on keyboard 14b before selecting the position of second point 50 that places worksurface 46.

Figure 11:
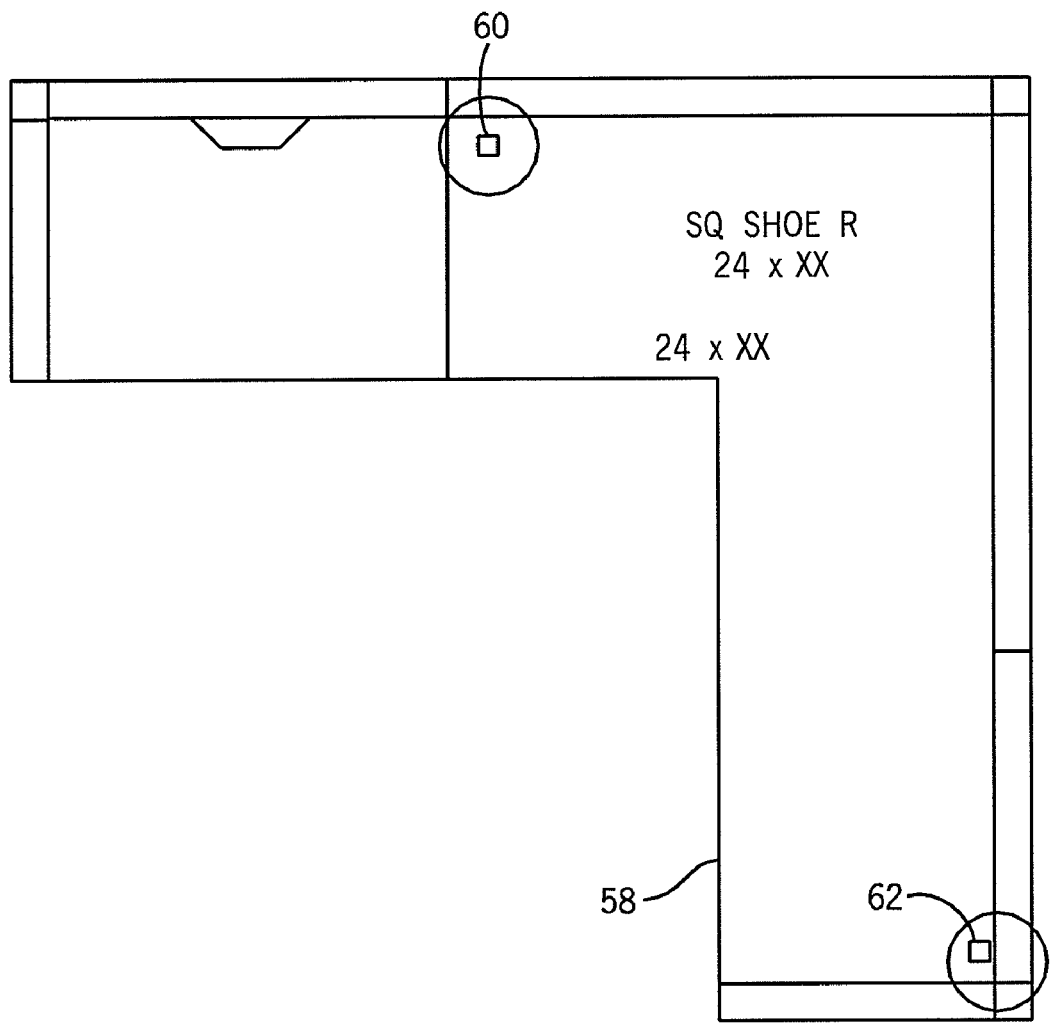
FIG. 11 is a sample screen shot depicting a square shoe worksurface.

Referring to FIG. 11, in order to position square show worksurface 58, a user utilizes mouse 14a to select points 60 and 62 at the back corners of worksurface 58. The depth of worksurface 58 can also be adjusted to predetermined depths, e.g. 24 or 30 inches, by using the Right-Click feature or the D key toggle described above.

In order to place an overhead in the design, the overhead command is utilized. Mouse 14a is used to hover a cursor over the panel or workspace position in the drawing, as heretofore described. The user has the option to toggle the style of overhead using keyboard 14b or a right-click option on mouse 14a. The software program determines the existing objects in the floor plan near the cursor, analyzes the same and provides menu 64 for the user to input a selection, FIG. 12. This program reviews the differences between various product lines and ensures the correct overhead is specified.

If the program determines that a correct overhead has been specified, ghost image 66 is activated near the cursor and the user is provided with an indication that the initial design criteria have been met, FIG. 13. The user then utilizes mouse 14a to select a point on the drawing. The objects near the selected point are reviewed and analyzed in more detail. More specifically, overhead 68 is analyzed for interference with tackboards, screens, panel heights, existing overhead heights, and off module requirements. If the second stage of analysis passes, overhead 68 is placed in the drawing, FIG. 14. The program then adjusts the overhead parameters based of the information found in the detailed analysis (e.g., the program may change the 3D elevation of the overhead if an existing overhead was found).

Figure 15:
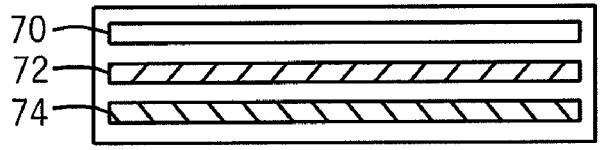
FIG. 15 is a color chart depicting various volition screens.

The software program of the present invention also incorporates a volition screen macro that is designed to search out valid locations in the workspace for both surface and stanchion mounted screens. When both an overhead and a worksurface are present, the type of screen specified is dependent on the cursor position. It is contemplated for the ghost image and text to reflect the type of screen to be specified prior to the selection. Referring to FIG. 15, it is contemplated for the color of the ghost image to indicate the style of the screen. By way of example, yellow may refer to upholstered screen 70, blue may refer to translucent screen 72 and grey may refer to exposed screen 74.

Figure 16:
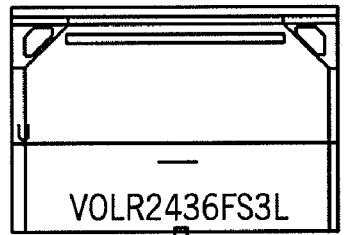
FIG. 16 is a sample screen shot depicting a worksurface mounted screen.
Figure 17:
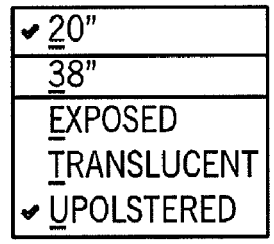
FIG. 17 is a sample screen shot depicting a double stanchion mounted screen.
Figure 18:
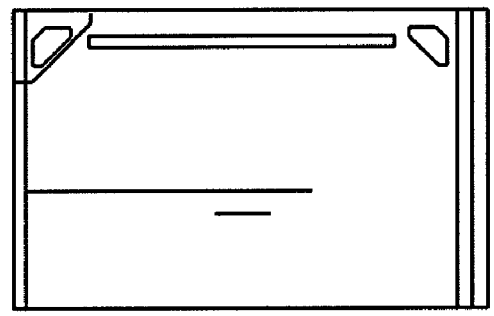
FIG. 18 is a sample screen shot depicting a shared stanchion/end mount screen.
Figure 19:
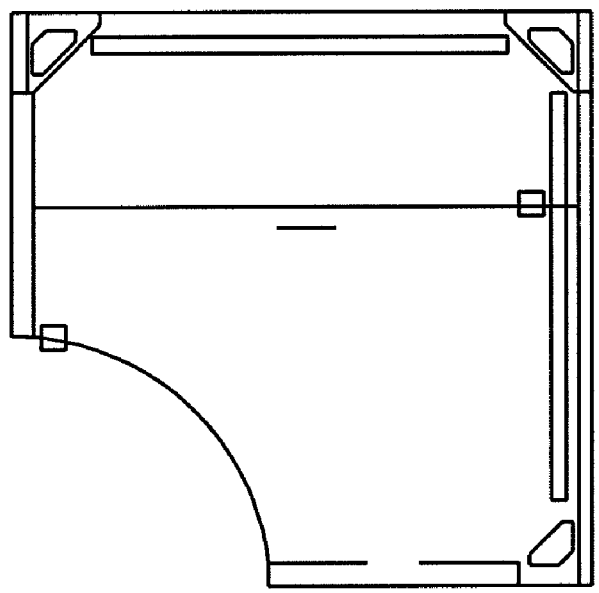
FIG. 19 is a sample screen shot depicting an alternate embodiment of a shared stanchion/end mount screen.

In order to properly locate a worksurface mounted screen, the user uses mouse 14b to hover the cursor over the midpoint of the leading edge of the worksurface to specify a worksurface mounted screen. The user right-clicks mouse 14b while the ghost image is displayed to change the height and style of the screen, FIG. 16. In order to properly locate a stanchion-mounted screen, the user uses mouse 14b to hover the cursor over the midpoint of the overhead to specify a double stanchion screen, FIG. 17. In order to properly locate a shared stanchion screen, an overhead cabinet or stanchion must already exist. The user uses mouse 14b to hover the cursor within a predetermined distance, e.g., 5 inches, of the front corner of the worksurface to specify a shared stanchion screen, FIG. 18. If an overhead cabinet or stanchion does not exist in this situation, a surface-mounted screen is specified. In order to properly locate a shared stanchion screen on a curvilinear corner, the user uses mouse 14b to hover near the front corner of the overhead cabinet where the overhead cabinet intersects with a modesty panel on the back corner to place the screen, FIG. 19. Alternatively, the shared stanchion screen may be location near the front corner of the surface on the same side as the overhead. All other locations on the surface will specify a surface mounted screen and all other locations on the overhead will specify a double stanchion mounted screen on the overhead.

Various modes of carrying out the invention are contemplated as being within the scope of the following claims particularly pointing out and distinctly claiming the subject matter that is regarded as the invention.

I claim:

1. A method of designing a workspace on a computer screen, comprising the steps of:
   depicting a predetermined area on the computer screen representative of the workspace and including one or more existing objects;
   selecting one of a plurality of objects from a menu of objects for positioning in the predetermined area and providing the same as a selected object;
   moving a cursor to a user desired location on the computer screen, wherein the selected object is associated with the cursor;
   validating that the selected object may be positioned in the predetermined area with the one or more existing objects already positioned in the predetermined area;
   generating a ghost image of the selected object on the computer screen at the user desired location only after validating that the selected object may be positioned at the user desired location;
   automatically adjusting one or more physical parameters of the selected object based upon the one or more existing objects already positioned in the predetermined area; and
   placing the selected object having the adjusted parameters in the predetermined area on the computer screen when the validating step determines that the selected object may be positioned in the predetermined area.

2. The method of claim 1 wherein the plurality of objects are various types of office furniture components.

3. The method of claim 1 wherein the one of the plurality of objects is selected from the group including tackboards, markerboards, load bars, tool rails, pedestals, task lights, worksurfaces, countertops, support panels, support brackets, worksurface accessories, center drawers, keyboards, electrical components, outlets, jumpers, connectors, and feeds.

4. The method of claim 1 further comprising the steps of determining a color graphic associated with the selected object and displaying the ghost image with the color graphic.

5. The method of claim 1 further comprising the step of displaying design options for the selected object with the ghost image.

6. A non-transitory workspace design module stored on a computer readable medium and operative with a computer aided design program, the design module comprising:
   a stored program representative of instructions to be executed by a central processing unit of a computer that causes the central processing unit to:
   graphically depict a workspace on a computer screen;
   display a menu of workspace furniture components available for the workspace;
   associate a selected workspace furniture component with a cursor;
   validate that the selected workspace furniture component may be positioned at a user defined location in the workspace with an existing workspace furniture component positioned in the workspace;
   generate a ghost image for a selected workspace furniture component only after validation of the location;
   display the ghost image on the computer screen at the location of the cursor;
   automatically adjusting one or more physical parameters of the selected object based upon the one or more existing objects already positioned in the predetermined area; and
   place the selected workspace furniture component having the adjusted parameters at the user defined location in the workspace based on a position of the ghost image on the computer screen and the validation of the user defined location.

7. The module of claim 6 wherein the furniture components include tackboards, markerboards, load bars, tool rails, pedestals, task lights, worksurfaces, countertops, support panels, support brackets, worksurface accessories, center drawers, keyboards, electrical components, outlets, jumpers, connectors, and feeds.

8. The module of claim 6 wherein the instructions further cause the computer to determine a color graphic associated with the selected workspace furniture component and display the ghost image with the color graphic.

9. The module of claim 6 wherein the instructions further cause the computer to display design options for the selected workspace furniture component with the ghost image.

* * * * *